United States Patent
Wienhold et al.

(10) Patent No.: US 10,937,299 B2
(45) Date of Patent: Mar. 2, 2021

(54) CURRENT DIAGNOSTICS FOR FIELD DEVICES

(71) Applicant: Rosemount Inc., Shakopee, MN (US)

(72) Inventors: Nicholas Aaron Wienhold, Waconia, MN (US); Andrew James Bronczyk, Cologne, MN (US)

(73) Assignee: ROSEMOUNT INC., Shakopee, MN (US)

( * ) Notice: Subject to any disclaimer, the term of this patent is extended or adjusted under 35 U.S.C. 154(b) by 565 days.

(21) Appl. No.: 15/617,506

(22) Filed: Jun. 8, 2017

(65) Prior Publication Data

US 2018/0357883 A1    Dec. 13, 2018

(51) Int. Cl.
*G08B 21/18*   (2006.01)
*H04Q 9/00*    (2006.01)
*G01R 19/165*  (2006.01)
*H02M 1/00*    (2006.01)

(52) U.S. Cl.
CPC ..... *G08B 21/185* (2013.01); *G01R 19/16538* (2013.01); *G08B 21/182* (2013.01); *H02M 1/00* (2013.01); *H04Q 9/00* (2013.01); *H02M 2001/0009* (2013.01); *H04Q 2209/823* (2013.01); *H04Q 2209/86* (2013.01)

(58) Field of Classification Search
CPC ........... G08B 21/182; G08B 21/185; G01R 19/16538; H02M 1/00
USPC ............................................. 340/635; 30/635
See application file for complete search history.

(56) References Cited

U.S. PATENT DOCUMENTS

| | | | |
|---|---|---|---|
| 5,179,488 A | | 1/1993 | Rovner |
| 5,302,945 A | * | 4/1994 | Stoltenberg ............ A01K 3/005 256/10 |
| 5,481,200 A | | 1/1996 | Voegele et al. |
| 5,793,297 A | * | 8/1998 | Takeuchi .................. G01D 3/08 324/500 |
| 7,018,800 B2 | | 3/2006 | Huisenga et al. |
| 7,321,846 B1 | * | 1/2008 | Huisenga .................. H04L 1/24 702/183 |
| 7,590,511 B2 | | 9/2009 | Huisenga et al. |
| 8,000,841 B2 | * | 8/2011 | Orth ....................... G08C 19/02 700/22 |

(Continued)

FOREIGN PATENT DOCUMENTS

| | | |
|---|---|---|
| CN | 202694194 U | 1/2013 |
| CN | 207557704 U | 6/2018 |

OTHER PUBLICATIONS

Notification of Transmittal of the International Search Report and the Written Opinion of the International Searching Authority from PCT/US2018/025049, dated Jun. 26, 2018.

(Continued)

*Primary Examiner* — Omar Casillashernandez
(74) *Attorney, Agent, or Firm* — Westman, Champlin & Koehler, P.A.

(57) ABSTRACT

A field device for an industrial process includes a current detector for detecting the amount of current consumed by the field device and an interface allowing the field device to communicate with at least one other device. The interface communicates a first alert when the amount of current consumed by the field device exceeds a first threshold and a second alert when the amount of current consumed by the field device is below a second threshold.

27 Claims, 4 Drawing Sheets

(56) References Cited

U.S. PATENT DOCUMENTS

| | | | |
|---|---|---|---|
| 8,786,128 B2* | 7/2014 | Schulte | G05B 19/0423 307/1 |
| 9,182,256 B2* | 11/2015 | Wehrs | G01D 21/00 |
| 9,310,794 B2* | 4/2016 | Arunachalam | G05B 19/0423 |
| 2005/0030185 A1 | 2/2005 | Huisenga et al. | |
| 2005/0030186 A1* | 2/2005 | Huisenga | G01R 19/2509 340/635 |
| 2011/0010120 A1 | 1/2011 | Wehrs et al. | |
| 2013/0106369 A1 | 5/2013 | Arunachalam et al. | |
| 2018/0357883 A1 | 12/2018 | Wienhold et al. | |

OTHER PUBLICATIONS

Office Action from Chinese Patent Application No. 201710767210. 7, dated Sep. 2, 2020.

Communication from European Patent Application No. 18718560. 8, dated Jan. 7, 2020.

\* cited by examiner

CURRENT DIAGNOSTICS FOR FIELD DEVICES

FIELD

The various embodiments relate to industrial process field devices. In particular, the embodiments relate to current diagnostics for such field devices.

BACKGROUND

Process field devices are used in industrial process control systems to monitor and/or control industrial processes. A control device is a process field device which is used to control the process. Example control devices include pumps, valves, actuators, solenoids, motors, mixers, agitators, breakers, crushers, rollers, mills, ball millers, kneaders, filters, blenders, cyclones, centrifuges, towers, dryers, conveyors, separators, elevators, hoists, heaters, coolers, and other such equipment. A process transmitter is a process field device which is used to sense (or monitor) operation of the process, for example by monitoring a process variable such as temperature, pressure, flow, etc. The monitored process variable is transmitted so that it can be used by other equipment in the process, for example by a central control room.

Two-wire process field devices receive power from and communicate over a two-wire process control loop. One standard type of two-wire process control loop uses a 4-20 mA current level on the control loop to represent a process variable or a state of a control device. In such a configuration, a field device can control the current level to a value, such as 10 mA, which is representative of a sensed process variable such as pressure. In other embodiments, digital values are encoded on the two-wire loop using a communication standard such as the HART® communication protocol, Fieldbus or Profibus, for example.

SUMMARY

A field device for an industrial process includes a current detector for detecting the amount of current consumed by the field device and an interface allowing the field device to communicate with at least one other device. The interface communicates a first alert when the amount of current consumed by the field device exceeds a first threshold and a second alert when the amount of current consumed by the field device is below a second threshold.

In accordance with a further embodiment, a field device for an industrial process includes an interface that allows the field device to communicate with at least one other device. The interface communicates an alert that indicates that the field device is functioning improperly when an amount of current consumed at the field device is below a threshold.

In accordance with a still further embodiment, an industrial process field device includes device circuitry, a two-wire loop connection and a power regulator that provides regulated power to the device circuitry based on unregulated power provided on the two-wire loop connection. A quiescent current detector provides a binary indication of whether current passing through the power regulator exceeds a threshold, wherein the binary indication is provided to the device circuitry. Interface circuitry is connected to the device circuitry and the two-wire loop connection and provides a signal to the two-wire loop connection indicative of an alert that the field device is functioning improperly when the device circuitry receives the binary indication that the current passing through the power regulator exceeds the threshold.

DETAILED DESCRIPTION OF ILLUSTRATIVE EMBODIMENTS

Figure 1:
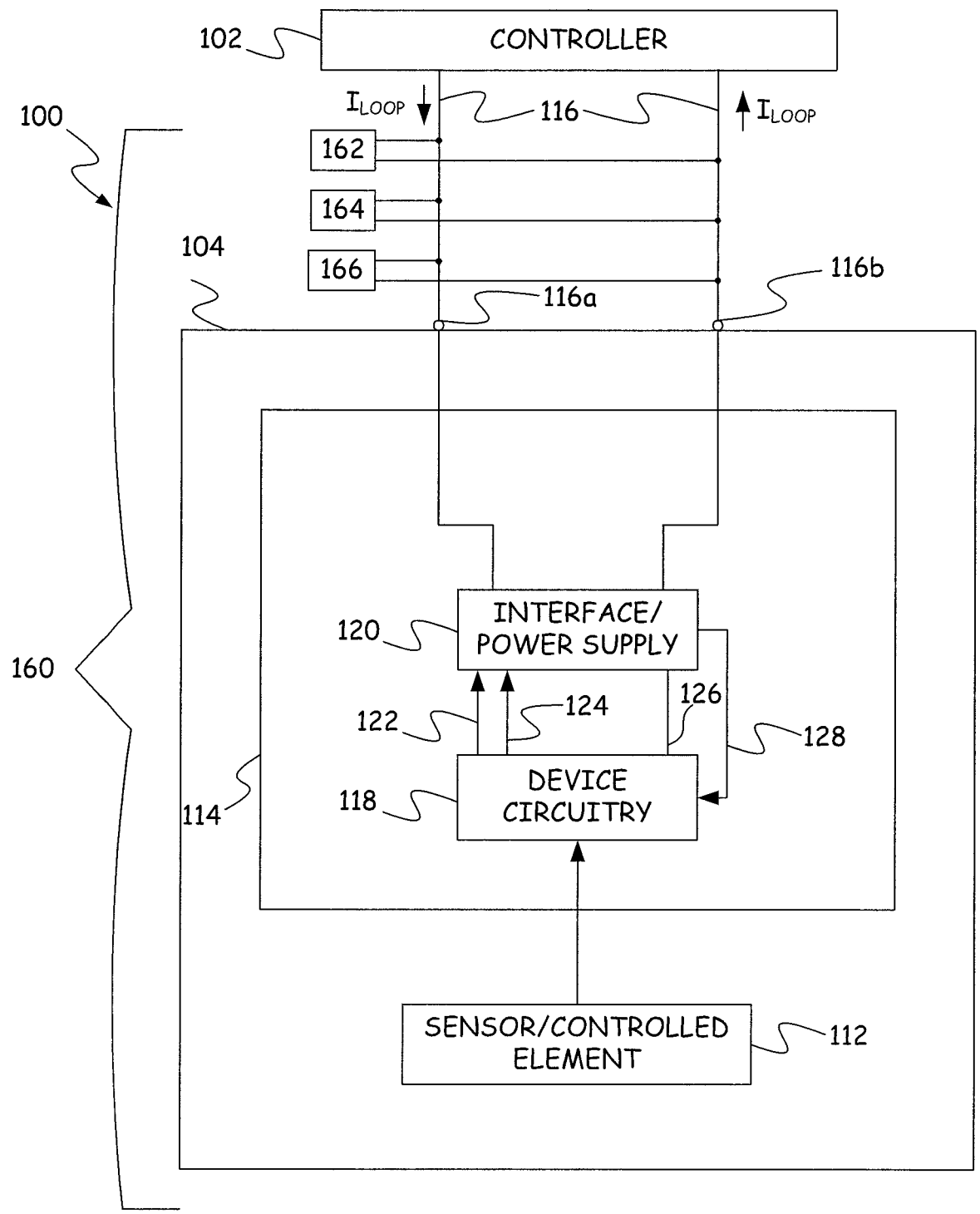
FIG. 1 provides a block diagram of an industrial process control system.

FIG. 1 is a block diagram of a process environment 100 that includes a controller 102 and a segment 160 of field devices including field devices 162, 164, 166 and 104 that are connected along a two-wire control loop 116 emanating from controller 102. Field device 104 includes sensor/controlled element 112 and electronics 114, which is coupled to two-wire control loop 116 at two-wire loop connections 116a and 116b. Electronics 114 includes device circuitry 118 and interface/power supply circuitry 120. In accordance with one embodiment, field device 104 is in communication with controller 102 and optionally field devices 162, 164 and 166. In addition, field devices 104, 162, 164 and 166 receive power from controller 102 through two-wire loop 116.

When field device 104 is a process transmitter it generates a process variable measurement value such as temperature, pressure, or flow based on signals from sensor 112 and transmits the information to the controller over two-wire loop 116. When field device 104 is a process control device, it alters controlled element 112 based on instructions sent over two-wire loop 116 from controller 102 and/or provides state information regarding controlled element 112 to controller 102 and field devices 162, 164 and 166 over two-wire loop 116. In accordance with some embodiments, field device 104 can communicate with controller 102 or the other field devices 162, 164 and 166 by modulating current $I_{loop}$ to convey information using one or more communication protocols such as Fieldbus and Profibus.

In the embodiment shown in FIG. 1, field devices 162, 164, 166 and 104 are shown as being connected in parallel along two-wire loop 116 in accordance with the Fieldbus standard. In other embodiments, field devices 162, 164, 166 and 104 are connected in series along two-wire loop 116 forming a multi-drop loop in accordance with the HART® communication protocol. The embodiments described below may be used with both parallel and serial connections to two-wire loop 116 and may be used with any desired communication protocol. In still further embodiments, the process variable or state information is sent as an analog signal by setting the current $I_{loop}$ in loop 116 to a value between 4 mA and 20 mA.

Interface/power supply 120 of field device 104 alters the current $I_{loop}$ on two-wire loop 116 to transmit information from field device 104. Interface/power supply 120 also monitors the current on two-wire loop 116 to receive information transmitted on two-wire loop 116 by controller 102 and field devices 162, 164 and 166. Lastly, interface/power supply 120 draws power from two-wire loop 116 for device circuitry 118 and sensor/controlled element 112.

In this embodiment, interface/power supply 120 receives digital information from device circuitry 118 over a data line 124 and analog information concerning sensor/controlled element 112 along analog line 122. Information received from loop 116 is provided to device circuitry 118 through a data line 126. Additionally, electrical power is supplied to device circuitry 118 by interface/power supply 120 over power line 128.

Because field device 104 uses two-wire loop 116 as a communication channel and as a power source, the current and voltage along two-wire loop 116 must accommodate both communication and power. When too much power is consumed by field device 104, communications from and to the field device can be impacted. For instance, if the field device consumes more than 4 mA of current, it is no longer possible to set the loop current to 4 mA and as such, the field device would no longer be able to communicate the full range of values for a process variable using the analog current on two-wire loop 116. In addition, when there are multiple field devices on a segment, excess current draws by one of the field devices may starve the other field devices of power causing communication from all of the field devices to fail and in some circumstances causing the power supply of the entire segment to collapse.

In addition, it has been observed that field devices that are not drawing an expected amount of current may also be functioning improperly. In particular, if one or more components in device circuitry 118 are failing, they may not execute all of their functions and as such will not use all the power they are expected to use.

By detecting when the device circuitry is using too much power or is not using enough power, the various embodiments described below allow an alert to be issued so that the field device can be replaced before the field device loses the ability to perform a function designated for the field device such as providing a value for a process variable or a state for a controlled element. Thus, the field device can be replaced before it provides an erroneous value for a process variable. In addition, the alert is issued before the field device impacts the operation of other field devices in a segment of field devices.

Figure 2:
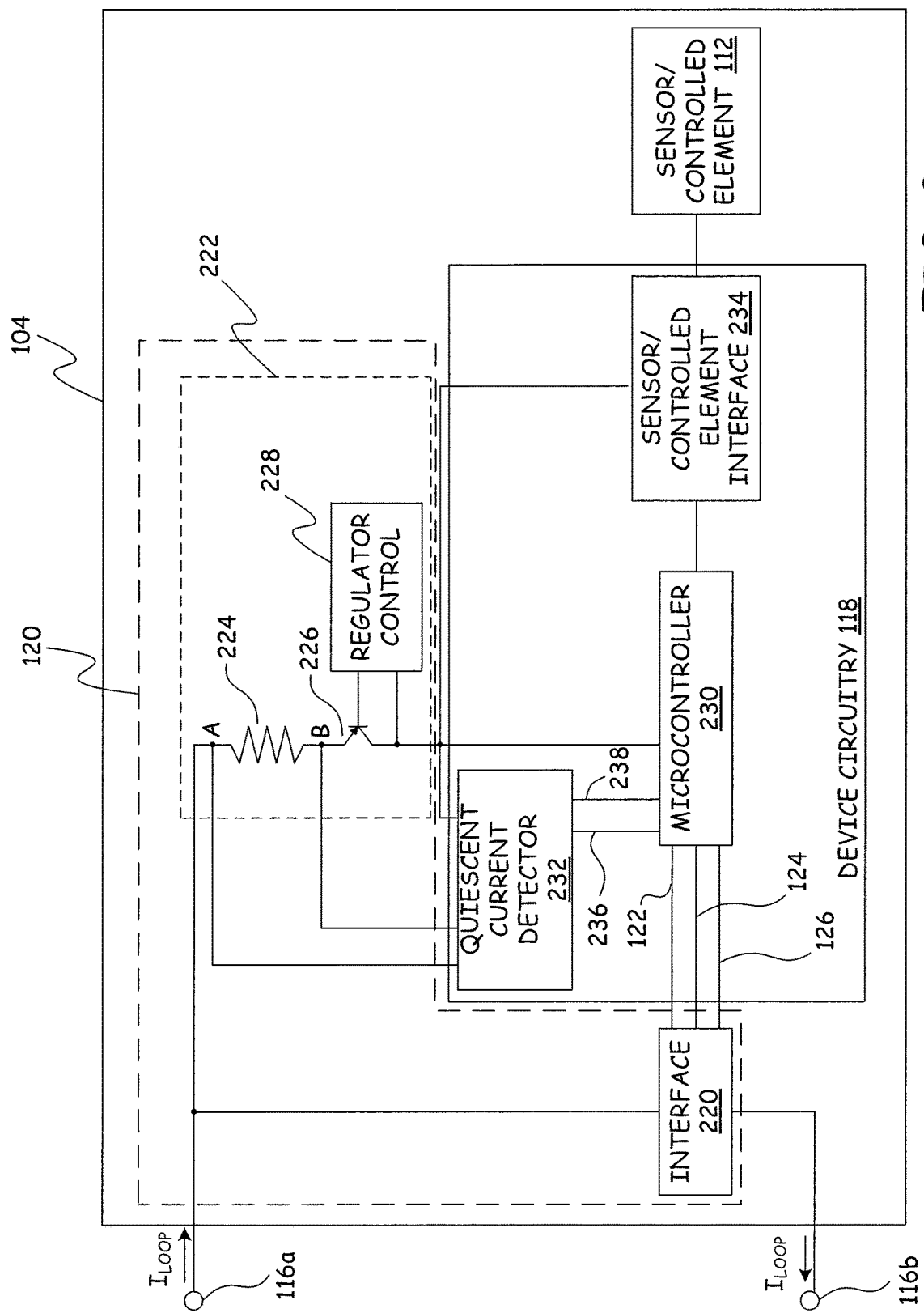
FIG. 2 provides a block diagram of a field device in accordance with one embodiment.

FIG. 2 provides a more detailed block diagram of an embodiment of field device 104. In FIG. 2, interface/power supply 120 is shown to include an interface 220 and a power regulator 222. Interface 220 is connected in series with two-wire loop 116 at two-wire loop connections 116a and 116b and is connected to a microcontroller 230 in device circuitry 118 by data line 124, analog line 122, and data line 126.

Power regulator 222 is connected to two-wire loop connection 116a of two-wire loop 116 and includes a transistor 226, a regulator control 228 and a resistance element in the form of a resistor 224. Regulator control 228 is connected to the base and collector of transistor 226. Side A of resistance element 224 represents an unregulated voltage that is input to field device 104 from loop 116. The collector of transistor 226 represents a regulated voltage that is used to power device circuitry 118. Regulator control 228 controls the current passing through transistor 226 to maintain the voltage at the collector of transistor 226 at a steady state. The regulated voltage from the collector of transistor 226 is provided to a quiescent current detector 232, microcontroller 230 and a sensor/controlled element interface 234 of device circuitry 118. Thus, the power consumed by device circuitry 118 passes through power regulator 222.

In accordance with one embodiment, the current consumed at device circuitry 118 is measured by measuring the voltage across resistance element 224. In accordance with one embodiment, this voltage is compared to two separate threshold voltages to provide two respective binary outputs 236 and 238. Binary output 236 indicates whether the voltage across resistance element 224 exceeds a first, high voltage, threshold and binary output 238 indicates whether the voltage across resistance element 224 is below a second, low voltage, threshold. Outputs 236 and 238 are provided to microcontroller 230, which issues an alert when the voltage across resistance element 224 exceeds the high voltage threshold and issues a second alert when the voltage across resistance element 224 is below the low voltage threshold. These alerts are sent as digital signals along data line 124 and cause interface 220 to communicate the alerts along two-wire loop 116.

Because quiescent current detector 232 issues two binary signals that change value when the current drawn by device circuitry 118 is either above a first threshold or below a second threshold, microcontroller 230 does not need to perform any lookup functions before being triggered to send the alerts. As such, microcontroller 230 is more efficient and consumes less power than if microcontroller 230 had to compare the voltages measured by quiescent current detector 232 against stored voltage values to determine whether to send an alert.

Figure 3:
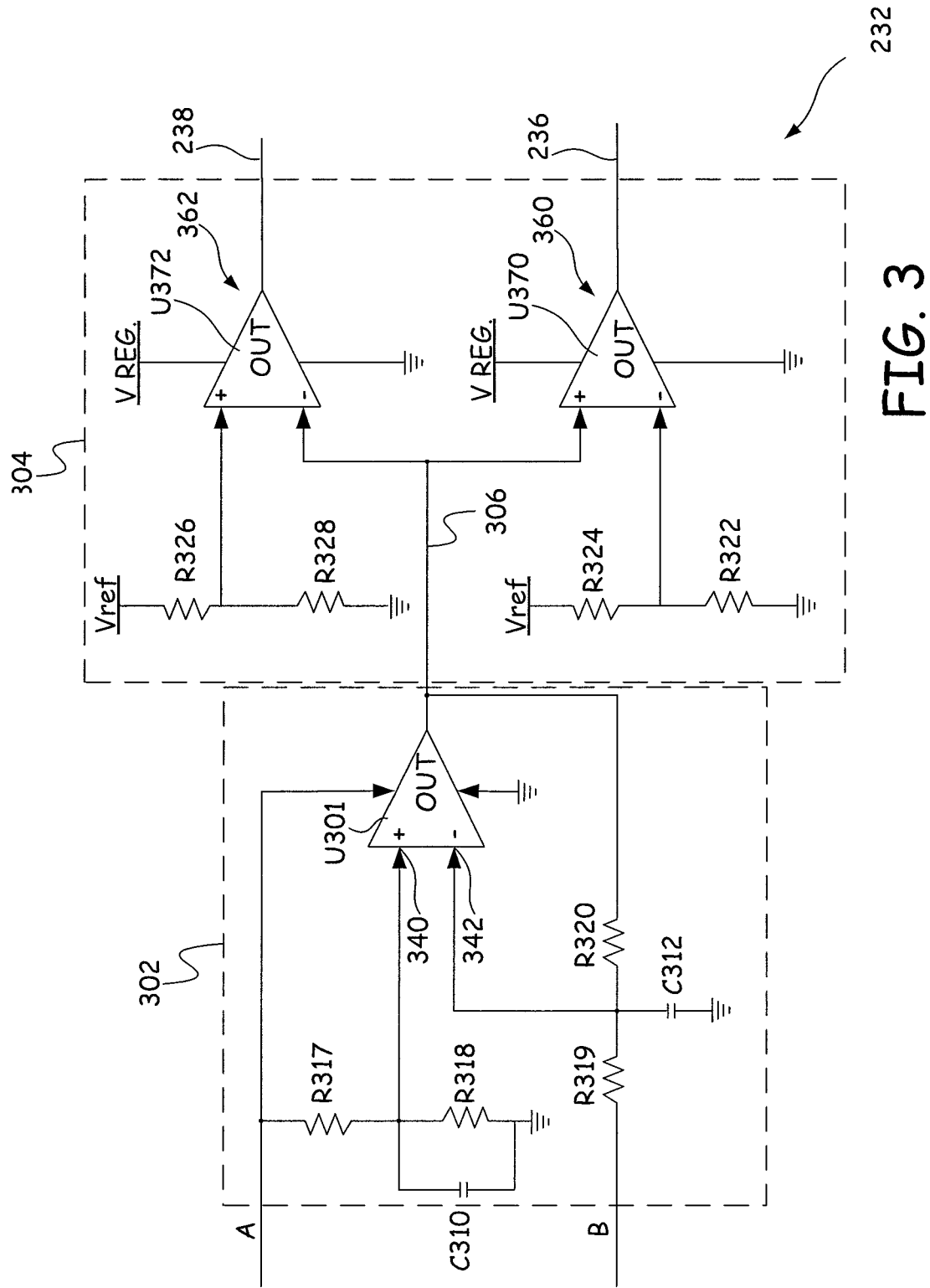
FIG. 3 provides a circuit diagram of a quiescent current detector in accordance with one embodiment.

FIG. 3 provides a circuit diagram in accordance with one embodiment of quiescent current detector 232. Quiescent current detector 232 of FIG. 3 has two stages, an amplifier stage 302 and a comparator stage 304. Amplifier stage 302 receives the voltages on the two sides of resistance element 224, A and B, and generates an output 306 that is provided to comparator stage 304. In accordance with one embodiment, amplifier stage 302 implements a difference amplifier that provides an amplified version of the difference in the voltage between points A and B. In accordance with the embodiment shown in FIG. 3, the difference amplifier is implemented by an operational amplifier U301 that has a non-inverting input 340 that is connected to the junction between two resistors R317 and R318, which are connected in series between point A and ground. Operational amplifier U301 also has an inverting input 342 that is connected to the junction between resistors R319 and R320. Resistors R319 and R320 are connected in series between point B and the output 306 of operational amplifier U301. In the embodiment of FIG. 3, resistors R318 and R320 have identical resistance values and resistors R317 and R319 have identical resistance values. In addition, the ratios R320/R319 and R318/R317 are selected to provide a desired amplification. In accordance with one embodiment, these ratios are set to 10 by setting the resistance of resistors R320 and R318 to 1 MΩ and the resistance of resistors R317 and R319 to 100 kΩ. Thus, the voltage on output 306 of operational amplifier U301 is 10 times the voltage difference between points A and B across resistance element 224.

In addition to amplifying the voltage between points A and B, amplifier stage 302 also acts as a low-pass filter to remove communication signals present on two-wire loop 116 that are found in the current passing through power regulator 222. In particular, non-inverting input 340 and inverting input 342 are connected to ground by respective capacitors C310 and C312 so that high frequency signals present at points A and B are not transferred to operational amplifier U301 and thus are not present at output 306 of operational amplifier U301.

The output 306 of operational amplifier U301 is provided as input to two parallel comparators 360 and 362 in comparator stage 304. Comparator 360 compares the voltage on output 306 to a first threshold voltage and provides binary output 236, which changes from a negative value to a positive value when the output voltage exceeds a threshold voltage. Comparator 362 compares output 306 to a second threshold voltage and provides a binary output 238 that switches from being negative to being positive when output voltage 306 drops below a second threshold voltage.

Comparator 360 contains an operational amplifier U370 that has its non-inverting input connected to output 306 of amplifier stage 302. The inverting input of operational amplifier U370 is connected at the junction between resistors R324 and R322, which extend in series between a reference voltage and ground. In accordance with one embodiment, resistors R322 and R324 are identical resulting in one-half of the reference voltage being present at the inverting input. This voltage represents the upper threshold for the voltage across resistance element 224 and thus sets the threshold voltage for amplifier output 306 that will cause comparator output 236 to switch from a negative value to a positive value.

Comparator 362 includes an operational amplifier U372, which has an inverting input that is connected to amplifier output 306 and a non-inverting input that is connected at the junction between resistors R326 and R328. Resistors R326 and R328 are connected in series between the reference voltage and ground. In accordance with one embodiment, resistor R326 is three times as large as the resistor R328 creating a voltage at the non-inverting input of operational amplifier U372 that is one-third of the reference voltage. This voltage sets the lower threshold voltage for amplifier output 306 such that when the voltage of amplifier output 306 drops below one-third the reference voltage, comparator output 238 changes from a negative value to a positive value.

Since both comparator output 236 and 238 have only two possible values, a large positive value or a large negative value, they are considered to be binary outputs. Such binary outputs can be used as inputs to microcontroller 230 and allow microcontroller 230 to be triggered easily without microcontroller 230 having to do any lookup functions to determine whether to trigger an alert.

In accordance with one embodiment, when comparator output 236 transitions from a negative value to a positive value, microcontroller 230 issues an alert on data line 124, which is communicated through interface 220 to controller 102 and field devices 162, 164 and 166 to indicate that field device 104 is not functioning properly because it is consuming too much current. When comparator output 238 transitions from a negative value to a positive value, microcontroller 230 issues an alert on data line 124, which is communicated through interface 220 to controller 102 and field devices 162, 164 and 166 to indicate that the field device is not functioning properly because it is not consuming enough current.

Figure 4:
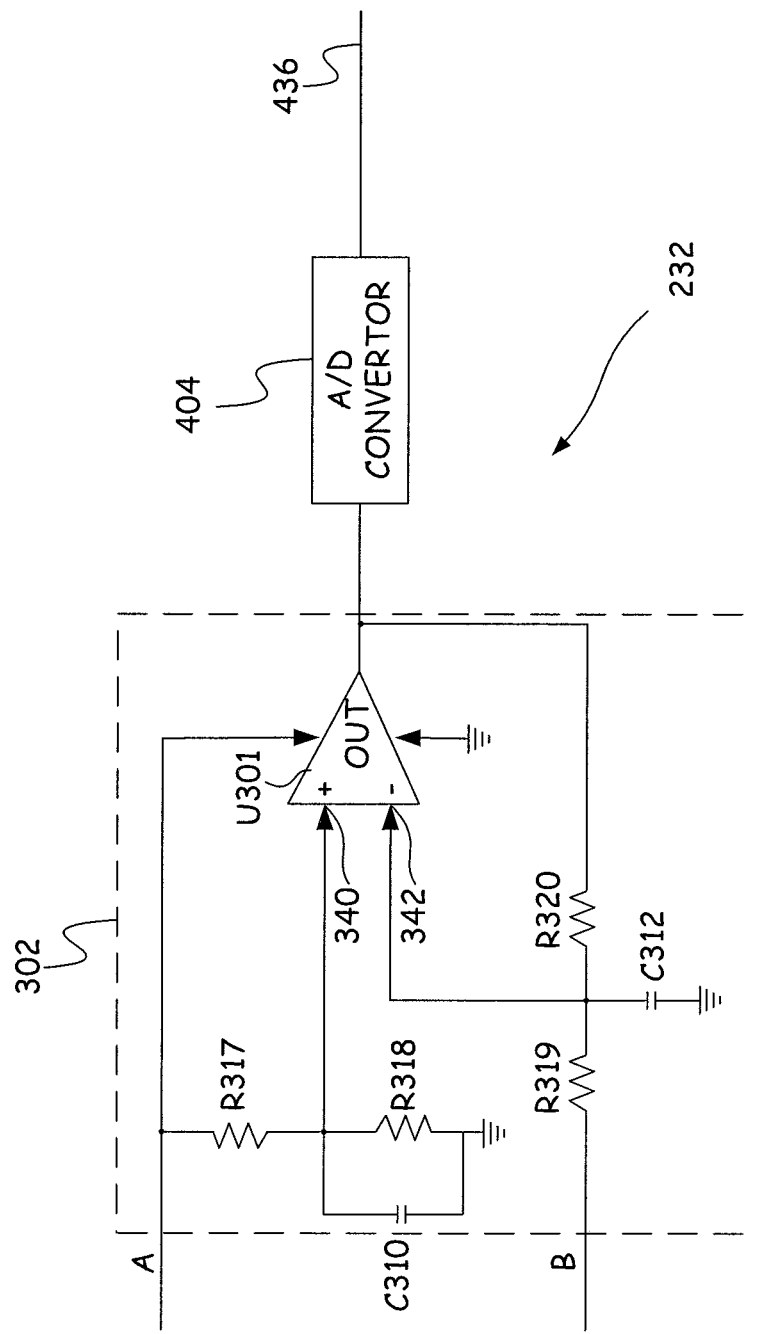
FIG. 4 provides a circuit diagram of a quiescent current detector in accordance with a second embodiment.

FIG. 4 provides a circuit diagram of an alternative embodiment in which comparator stage 304 and binary outputs 236 and 238 are replaced by an analog-to-digital converter 404 and a digital output 436. Analog-to-digital convertor 404 converts the analog voltage on amplifier output 306 into a digital value on digital output 436, which is then provided to microcontroller 230. Microcontroller 230 compares the output digital value to a first digital threshold value to determine if the field device is consuming more current than a first current threshold and compares the digital output to a second digital threshold to determine if the field device is consuming less current than a second current threshold. When the comparisons indicate that field device 104 is consuming more current than the first current threshold, microcontroller 230 issues an alert on data line 124, which is communicated through interface 220 to controller 102 and field devices 162, 164 and 166 to indicate that field device 104 is not functioning properly because it is consuming too much current. When the comparisons indicate that field device 104 is consuming less current than the second current threshold, microcontroller 230 issues an alert on data line 124, which is communicated through interface 220 to controller 102 and field devices 162, 164 and 166 to indicate that the field device is not functioning properly because it is not consuming enough current. In accordance with some embodiments, the alerts include an indication of the current consumed by field device 104 as determined from the digital version of amplifier output 306.

In accordance with one embodiment, the first current threshold and the second current threshold are stored within field device 104 and can be changed at any time by sending an instruction on two-wire loop 116 to field device 104 to change the thresholds.

In the embodiment of FIG. 4, analog-to-digital convertor 404 is shown as a separate component to microcontroller 230. In other embodiments, analog-to-digital convertor 404 is incorporated into microcontroller 230.

In further embodiments, in addition to sending the alerts, microcontroller 230 is triggered to execute diagnostic tests on the various components of field device 104 when it determines that the field device is consuming too much or too little current.

The alerts sent by the microcontroller 230 can further be used to replace field device 104 before field device 104 is unable to perform its primary function, such as producing an accurate process variable value, producing an accurate state of the controlled element 112, or altering the sensor or controlled element 112 based on an instruction received through interface 220. As a result, quiescent current detectors of the various embodiments are able to identify field devices that are likely to fail in the future and allow those field devices to be replaced before they fail.

Although elements have been shown or described as separate embodiments above, portions of each embodiment may be combined with all or part of other embodiments described above.

Although the present invention has been described with reference to preferred embodiments, workers skilled in the art will recognize that changes may be made in form and detail without departing from the spirit and scope of the invention.

What is claimed is:

1. A field device for an industrial process, the field device comprising:
   a current detector for detecting the amount of current consumed by the field device;
   an interface, allowing the field device to communicate with at least one other device, such that the interface communicates a first alert when the amount of current consumed by the field device exceeds a first threshold and a second alert when the amount of current consumed by the field device is below a second threshold.

2. The field device of claim 1 wherein the current detector detects an amount of current flowing through a power regulator in the field device.

3. The field device of claim 2 wherein the current detector comprises an amplifier stage and a comparator stage.

4. The field device of claim 3 wherein the amplifier stage removes communication signals present in the current flowing through the power regulator.

5. The field device of claim 3 wherein the amplifier stage provides an amplified voltage output and the comparator stage comprises two parallel comparators that each receives the amplified voltage as input.

6. The field device of claim 5 wherein a first of the two parallel comparators changes a first binary output when the amplified voltage is above a first threshold and a second of the two parallel comparators changes a second binary output when the amplified voltage is below a second threshold.

7. The field device of claim 6 further comprising a microcontroller that receives the first binary output and the second binary output and controls the interface to control when the first alert and the second alert are communicated based on the first binary output and the second binary output.

8. The field device of claim 1 wherein the interface communicates the first alert before the field device is unable to perform a function designated for the field device.

9. The field device of claim 8 wherein the function designated for the field device is to provide a value for a process variable.

10. The field device of claim 1 wherein the field device is part of a segment of field devices and wherein the interface communicates the first alert before the field device impacts the operation of other field devices in the segment of field devices.

11. The field device of claim 1 wherein the field device further comprises circuitry that is triggered to perform diagnostic tests on the field device when the amount of current consumed by the field device exceeds a first threshold.

12. The field device of claim 1 wherein the current detector provides a digital value representative of the amount of current consumed by the field device to a microcontroller and the microcontroller controls the interface to control when the first alert and the second alert are communicated based on the digital value.

13. A field device for an industrial process, the field device comprising:
an interface, allowing the field device to communicate with at least one other device, the interface communicating an alert that indicates that the field device is functioning improperly when an amount of current consumed at the field device is below a threshold.

14. The field device of claim 13 wherein the interface communicates a second alert that indicates that the field device is functioning improperly when an amount of current consumed at the field device is above a second threshold.

15. The field device of claim 14 further comprising a quiescent current detector that detects whether the amount of current consumed at the field device is below the threshold by determining if an amount of current passing through a power regulator in the field device is below the threshold and that detects whether the amount of current consumed at the field device is above the second threshold by determining if an amount of current passing through the power regulator is above the second threshold.

16. The field device of claim 15 wherein the quiescent current detector comprises an amplifier stage and a comparator stage wherein the amplifier stage amplifies a voltage that is based on the current passing through the power regulator and the comparator stage comprises two parallel comparators that each receives an output of the amplifier stage.

17. The field device of claim 13 wherein the interface communicates an alert that indicates that the field device is functioning improperly before the field device is unable to perform a function expected of the field device.

18. An industrial process field device comprising:
device circuitry;
a two-wire loop connection;
a power regulator that provides regulated power to the device circuitry based on unregulated power provided on the two-wire loop connection;
a quiescent current detector that provides a binary indication of whether current passing through the power regulator exceeds a threshold, wherein the binary indication is provided to the device circuitry;
interface circuitry connected to the device circuitry and the two-wire loop connection and providing a signal to the two-wire loop connection indicative of an alert that the field device is functioning improperly when the device circuitry receives the binary indication that the current passing through the power regulator exceeds the threshold.

19. The industrial process field device of claim 18 wherein the device circuitry is triggered to perform diagnostic tests on the industrial process field device when the device circuitry receives the binary indication that the current passing through the power regulator exceeds the threshold.

20. The industrial process field device of claim 18 wherein the quiescent current detector provides a binary indication of whether current passing through the power regulator is below a second threshold, wherein the binary indication of whether current passing through the power regulator is below the second threshold is provided to the device circuitry; and the interface circuitry provides a signal to the two-wire loop connection indicative of a second alert that the field device is functioning improperly when the device circuitry receives the binary indication that the current passing through the power regulator is below the second threshold.

21. The industrial process field device of claim 18 wherein the quiescent current detector comprises an amplifier stage and a comparator stage.

22. The industrial process field device of claim 21 wherein the amplifier stage comprises an amplifier with an inverting and non-inverting input, wherein the inverting input is coupled to a first side of a resistance in the power regulator and the non-inverting input is coupled to a second side of the resistance in the power regulator.

23. The industrial process field device of claim 22 wherein the inverting input and the non-inverting input are coupled to ground through respective capacitors to remove communication signals present on the two-wire loop connection.

24. The industrial process field device of claim 21 wherein the comparator stage comprises two parallel comparators that each receives a same output from the amplifier stage.

25. The industrial process field device of claim 24 wherein a first of the two parallel comparators compares the output from the amplifier stage to a first voltage and a second of the two parallel comparators compares the output from the amplifier stage to a second voltage.

26. The industrial process field device of claim 18 wherein the signal indicative of the alert that the field device is functioning improperly is provided to the two-wire loop connection before the field device provides an erroneous value for a measured process variable.

27. The industrial process field device of claim 18 wherein the signal indicative of the alert that the field device is functioning improperly is provided to the two-wire loop connection before a segment of industrial process field devices connected to the industrial process field device fails.

* * * * *